United States Patent
Ching et al.

(10) Patent No.: US 9,455,334 B2
(45) Date of Patent: Sep. 27, 2016

(54) METHOD OF FORMING A FIN STRUCTURE OF SEMICONDUCTOR DEVICE

(71) Applicant: Taiwan Semiconductor Manufacturing Company, Ltd., Hsin-Chu (TW)

(72) Inventors: Kuo-Cheng Ching, Zhubei (TW); Jiun-Jia Huang, Beigang Township (TW); Chao-Hsiung Wang, Hsin-Chu (TW); Chi-Wen Liu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/839,534

(22) Filed: Aug. 28, 2015

(65) Prior Publication Data

US 2015/0372120 A1 Dec. 24, 2015

Related U.S. Application Data

(62) Division of application No. 14/089,974, filed on Nov. 26, 2013, now Pat. No. 9,159,833.

(51) Int. Cl.
*H01L 21/76* (2006.01)
*H01L 29/66* (2006.01)
*H01L 29/78* (2006.01)

(52) U.S. Cl.
CPC ... *H01L 29/66795* (2013.01); *H01L 29/66545* (2013.01); *H01L 29/66636* (2013.01); *H01L 29/785* (2013.01); *H01L 29/7848* (2013.01)

(58) Field of Classification Search
CPC ............. H01L 21/823431; H01L 21/823481; H01L 21/823418; H01L 21/823437; H01L 21/02532; H01L 21/76224; H01L 21/0217; H01L 21/30604; H01L 21/02521; H01L 29/267; H01L 29/785; H01L 29/66795
USPC ................... 257/288, 368, 401; 438/283, 424
See application file for complete search history.

(56) References Cited

U.S. PATENT DOCUMENTS

| | | | |
|---|---|---|---|
| 6,359,311 B1 | 3/2002 | Colinge et al. | |
| 8,211,772 B2 * | 7/2012 | Kavalieros | H01L 29/66795 257/E21.409 |
| 8,362,572 B2 | 1/2013 | Huang et al. | |
| 9,147,682 B2 * | 9/2015 | Ching | H01L 21/823821 |
| 2007/0120156 A1 | 5/2007 | Liu et al. | |
| 2007/0267695 A1 | 11/2007 | Lee | |

(Continued)

OTHER PUBLICATIONS

English Translation of Korean Office Action dated Dec. 18, 2014 for co-pending Korean Application No. 10-2013-0155659.

(Continued)

*Primary Examiner* — Dung Le
(74) *Attorney, Agent, or Firm* — Slater Matsil, LLP

(57) ABSTRACT

A method of forming a fin structure of a semiconductor device, such as a fin field effect transistor FinFET is provided. In an embodiment, trenches are formed in a substrate, and a liner is formed along sidewalls of the trenches, wherein a region between adjacent trenches define a fin. A dielectric material is formed in the trenches. Portions of the semiconductor material of the fin are replaced with a second semiconductor material and a third semiconductor material, the second semiconductor material having a different lattice constant than the substrate and the third semiconductor material having a different lattice constant than the second semiconductor material. Portions of the second semiconductor material are oxidized.

20 Claims, 9 Drawing Sheets

(56) References Cited

U.S. PATENT DOCUMENTS

| | | |
|---|---|---|
| 2009/0278196 A1 | 11/2009 | Chang et al. |
| 2010/0163971 A1 | 7/2010 | Hung et al. |
| 2012/0086053 A1 | 4/2012 | Tseng et al. |
| 2012/0292672 A1 | 11/2012 | Cho |
| 2012/0319211 A1 | 12/2012 | van Dal et al. |
| 2013/0005114 A1 | 1/2013 | Maszara et al. |
| 2014/0008734 A1 | 1/2014 | Lu |
| 2014/0011341 A1 | 1/2014 | Maszara et al. |
| 2014/0203334 A1 | 7/2014 | Colinge et al. |
| 2014/0308806 A1 | 10/2014 | Chang et al. |
| 2014/0346574 A1 | 11/2014 | Cai et al. |
| 2014/0357029 A1 | 12/2014 | Loubet et al. |
| 2014/0361336 A1* | 12/2014 | Chen ............... H01L 29/785 257/190 |
| 2015/0015056 A1 | 1/2015 | Yamamoto |
| 2015/0024573 A1 | 1/2015 | Jacob et al. |
| 2015/0028426 A1 | 1/2015 | Ching et al. |
| 2015/0054039 A1 | 2/2015 | Ching et al. |
| 2015/0091100 A1 | 4/2015 | Xie et al. |
| 2015/0102411 A1* | 4/2015 | Ching ............... H01L 21/76205 257/347 |

OTHER PUBLICATIONS

Gas, P. et al, "Diffusion of Sb, Ga, Ge, and (As) in TiSi2," Journal of Applied Physics, vol. 63, No. 11, Jun. 1, 1998, pp. 5335-5345.

Tetelin, C. et al., "Kinetics and mechanism of low temperature atomic oxygen-assisted oxidation of SiGe layers," Journal of Applied Physics, vol. 83, No. 5, Mar. 1, 1998, pp. 2842-2846.

* cited by examiner

METHOD OF FORMING A FIN STRUCTURE OF SEMICONDUCTOR DEVICE This application is a divisional of U.S. patent application Ser. No. 14/089,974, entitled "Fin Structure of Semiconductor Device," filed on Nov. 26, 2013, now U.S. Pat. No. 9,159,833, which is incorporated herein by reference.

BACKGROUND

As the semiconductor industry has progressed into nanometer technology process nodes in pursuit of higher device density, higher performance, and lower costs, challenges from both fabrication and design issues have resulted in the development of three-dimensional designs, such as a fin field effect transistor (FinFET). A typical FinFET is fabricated with a thin vertical "fin" (or fin structure) extending from a substrate formed by, for example, etching away a portion of a silicon layer of the substrate. The channel of the FinFET is formed in this vertical fin. A gate is provided over (e.g., wrapping) the fin. Having a gate on both sides of the channel allows gate control of the channel from both sides. In addition, strained materials in source/drain (S/D) portions of the FinFET utilizing selectively grown silicon germanium (SiGe) may be used to enhance carrier mobility.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

The present disclosure is presented in terms of forming a fin field effect transistor (FinFET). It has been found that using a stressor, such as silicon germanium (SiGe), in a fin may result in germanium (Ge) migration along the sidewalls of the overlying semiconductor material. For example, in a situation in which a fin comprises a SiGe layer formed over a Si substrate, and a layer of Si formed over the SiGe layer, the Ge from the SiGe layer may migrate along the sidewalls of the overlying Si layer. In some situations, this Ge migration extends above an upper surface of the adjoining isolation regions (e.g., shallow trench isolations) and thereby may impact the effective fin width and reliability issue. Embodiments such as those disclosed herein provide a liner, such as an oxynitride layer, over the SiGe region to prevent or reduce the Ge migration.

Figure 1:
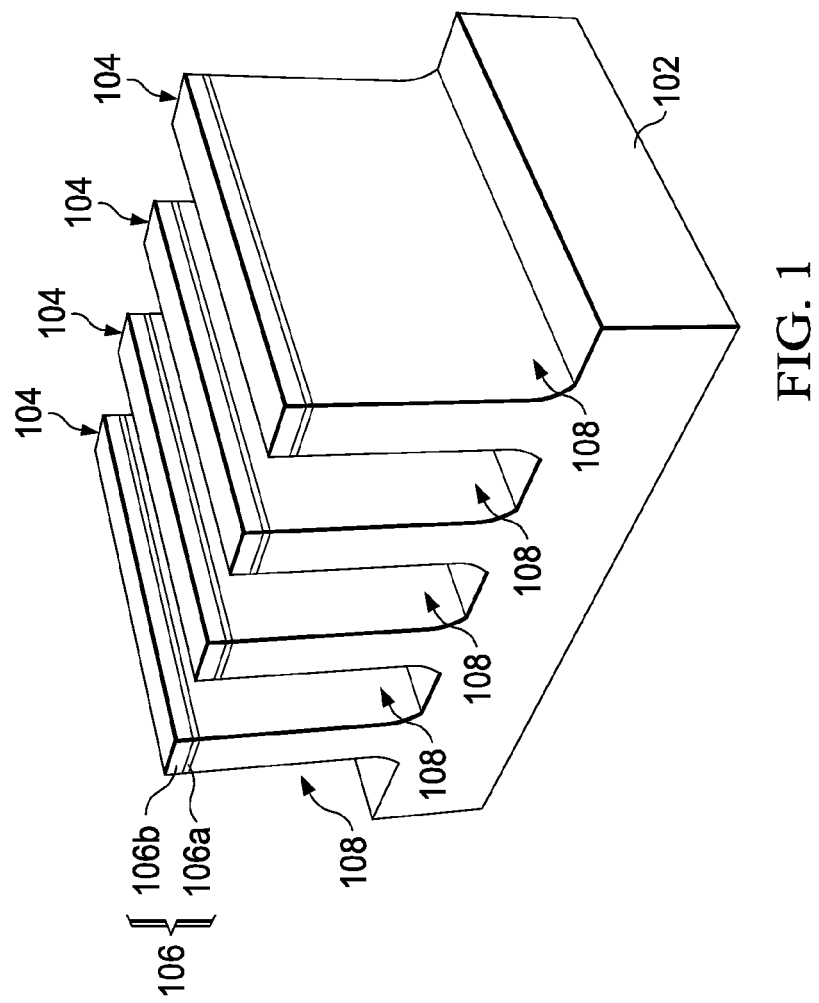
FIGS. 1-8 are cross-sectional views of a semiconductor device at various stages of fabrication according to various embodiments of the present disclosure.

Accordingly, FIGS. 1-8 illustrate various intermediate stages of a method of forming a semiconductor device in accordance with an embodiment. Referring first to FIG. 1, there is shown a substrate 102 having fins 104 extending therefrom. The substrate 102 is formed of a semiconductor having a first lattice constant. As will be explained in greater detail below, another semiconductor layer having a second lattice constant, different than the first lattice constant, will be formed over material of the substrate 102. In some embodiments, the substrate 102 comprises a crystalline silicon substrate (e.g., wafer). In some embodiments, the substrate 102 may be made of some other suitable elemental semiconductor, such as a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 102 may include an epitaxial layer (epi-layer), may be strained for performance enhancement, and/or may include a silicon-on-insulator (SOI) structure.

Furthermore, the substrate 102 may include other features. For example, the substrate may include various doped regions depending on design requirements (e.g., p-type substrate or n-type substrate). For example, the doped regions may be doped with p-type dopants, such as boron or $BF_2$; n-type dopants, such as phosphorus or arsenic; and/or combinations thereof. The doped regions may be configured for an n-type FinFET, or alternatively configured for a p-type FinFET.

The substrate 102 may be patterned using, for example, photolithography techniques. For example, a mask layer, such as a pad oxide layer and an overlying pad nitride layer, is formed over the substrate 102. The pad oxides layer may be a thin film comprising silicon oxide formed, for example, using a thermal oxidation process. The pad oxide layer may act as an adhesion layer between the substrate 102 and the overlying pad nitride layer and may act as an etch stop layer for etching the pad nitride layer. In an embodiment, the pad nitride layer is formed of silicon nitride, for example, using low-pressure chemical vapor deposition (LPCVD) or plasma enhanced chemical vapor deposition (PECVD).

The mask layer may be patterned using photolithography techniques. Generally, a photoresist material (not shown) is deposited, irradiated (exposed), and developed to remove a portion of the photoresist material. The remaining photoresist material protects the underlying material, such as the mask layer in this example, from subsequent processing steps, such as etching. In this example, the photoresist material is patterned to define the pad oxide 106a and pad nitride 106b, collectively referred to as a patterned mask 106, as illustrated in FIG. 1.

The patterned mask 106 is subsequently used to pattern exposed portions of the substrate 102 to form trenches 108, thereby defining fins 104 between adjacent trenches 108 as illustrated in FIG. 1. As will be discussed below, the trenches 108 will be subsequently filled with a dielectric material, forming isolation regions such as shallow trench isolation (STI) regions adjacent the fins 104. In some embodiments, the trenches 108 may be strips (viewed from in the top) parallel to each other, and closely spaced with respect to each other. In some embodiments, the trenches 108 may be continuous and surrounding the fins 104.

The photoresist material, if present, may be removed, and a cleaning process may be performed to remove a native oxide from the substrate 102. The cleaning may be performed using diluted hydrofluoric (DHF) acid.

Figure 2:
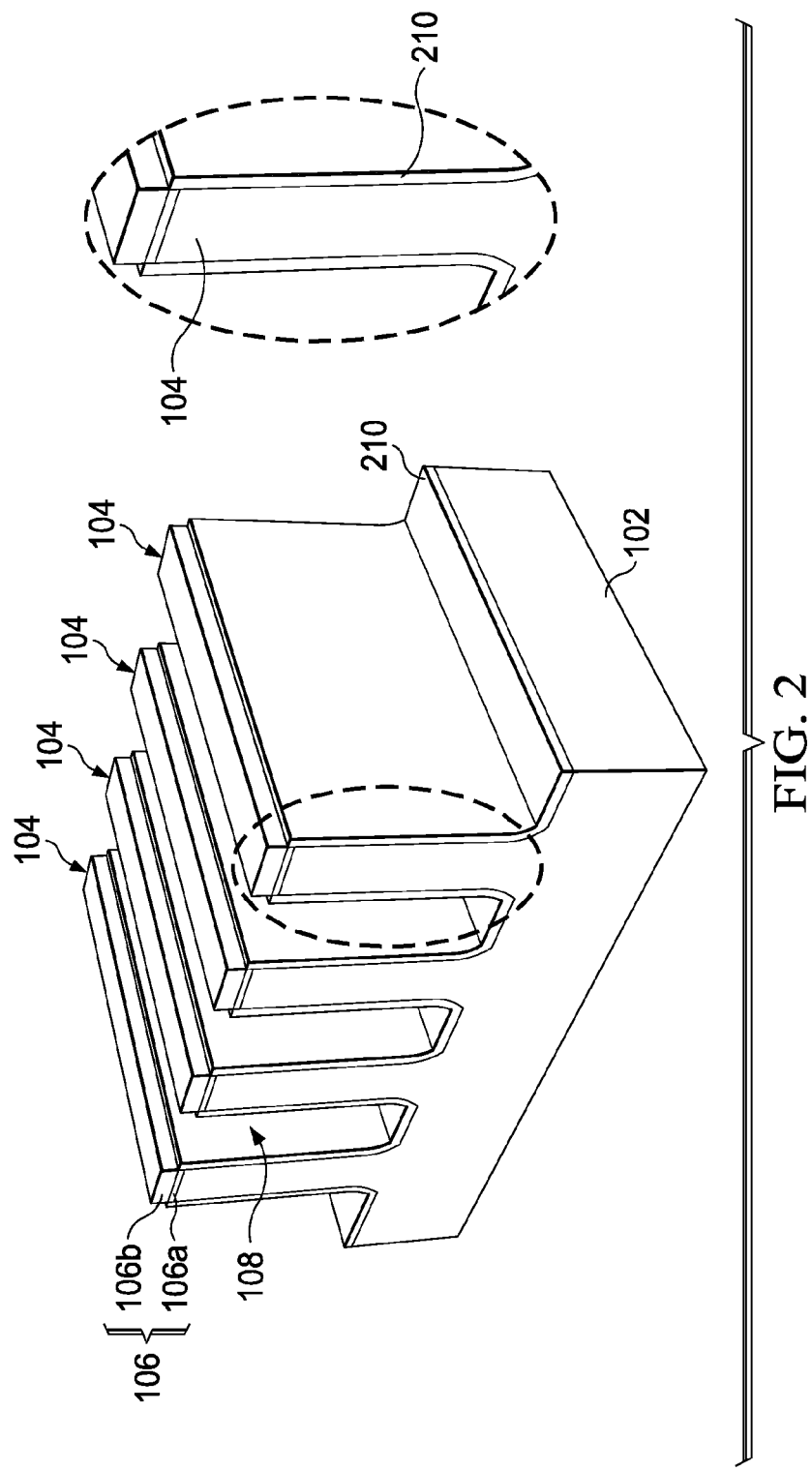

Turning now to FIG. 2, there is shown one or more liners 210 formed along exposed surfaces of the fins 104 in accordance with an embodiment. As will be explained in greater detail below, the fins 104 will be reformed using different types of semiconductor materials, such as silicon germanium, having different lattice constants and an oxidation process will be performed. During the oxidation process, some elements, such as germanium, may diffuse out into the surrounding material. The one or more liners 210 will act as a barrier to prevent or reduce this diffusion.

In an embodiment, the one or more liners 210 are formed using, for example, an oxidation process and a nitridation process. In some embodiments, the oxidation process comprises a thermal oxidation process, rapid thermal oxidation (RTO) process, chemical oxidation process, in-situ stream generation (ISSG) process, or enhanced in-situ stream generation (EISSG) process. For example, a thermal oxidation process may be performed in an oxygen-containing environment at a temperature of about 800° C. to about 1,000° C. for about 30 seconds to about 5 minutes to form an oxide layer having a thickness from about 10 nm to about 50 nm.

In some embodiments, the nitridation process comprises thermal nitridation with a furnace or rapid thermal anneal (RTA) using $NH_3$, $N_2O$, $N_2$, or the like ambient. The thermal nitridation may be performed at a temperature of about 400° C. to about 1,200° C. for a duration of about 10 seconds to about 3 hours. In other embodiments, the nitridation process may comprise a plasma nitridation and/or a nitrogen implant. For example, a plasma nitridation may be performed in an ambient of $NH_3$, $N_2O$, $N_2$, or the like at a temperature of about 80° C. to about 400° C. for a duration of about 10 seconds to about 1 hour. As another example, the nitrogen implant may be performed using an energy from about 5 keV to about 30 keV.

Other oxidation and nitridation processes may be used.

As a result of the oxidation and nitridation processes described above, one or two liner layers may be formed. The oxidation process results in an oxide layer having a determined thickness. The nitridation process results in the nitrogen atoms reacting with the oxide layer to form an oxynitride layer, such as a silicon oxynitride layer in an embodiment in which the substrate 102 is a silicon substrate. If a selected nitridation process is performed for a sufficient period of time, an entire thickness of the oxide layer may become an oxynitride layer. If a selected nitridation process is performed for a shorter period of time, a portion of the oxide layer may remain, resulting in an oxide layer and a nitride layer. The process conditions may be adapted to provide a desired thickness of the oxide layer and the nitride layer to prevent or reduce the Ge migration. In an embodiment, the resulting oxynitride layer has a thickness from about 3 nm to about 10 nm.

As explained in greater detail below, portions of the fins 104 will be replaced with other semiconductor materials having different lattice constants, such as forming a SiGe layer over a silicon substrate and a Si layer over the SiGe layer. As noted above the Ge of the SiGe has a tendency to migrate into the overlying Si layer, thereby possibly reducing the effective gate width and adversely affecting reliability. The one or more liners 210, e.g., an oxynitride liner, prevents or reduces the Ge migration. It is believed that other nitrogen-containing layers may be used to retard Ge diffusion.

Figure 3:
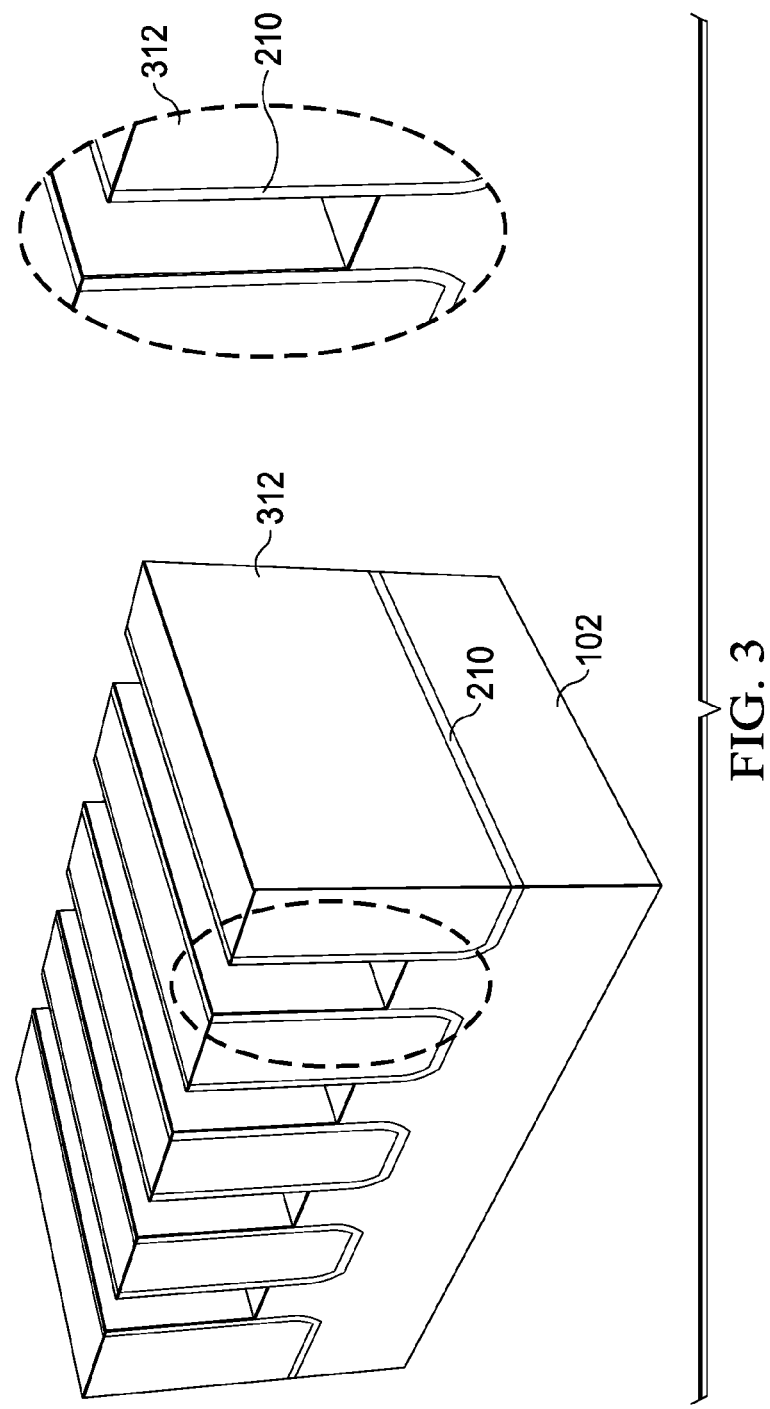

The one or more liners 210 may also reduce or prevent boron or other dopants from migrating into the surrounding isolation regions, e.g., STIs 312 (see FIG. 3). Boron and other dopants are used to dope the fins, providing for a conductive path through the fin and/or a conductive barrier to the substrate. These dopants, such as boron, may diffuse into the surrounding isolation regions. The one or more liners 210 help reduce or prevent this diffusion.

FIG. 3 illustrates the resulting structure after deposition of a dielectric material to form STIs 312 in accordance with an embodiment. In some embodiments, the trenches 108 (see FIG. 2) are filled with the dielectric material, such as silicon oxide, silicon nitride, fluoride-doped silicate glass (FSG), or a low-K dielectric material, may also be used. In some embodiments, the STIs 312 may be formed using a high-density-plasma (HDP) CVD process, using silane ($SiH_4$) and oxygen ($O_2$) as reacting precursors. In other embodiment, the STIs 312 may be formed using a sub-atmospheric CVD (SACVD) process or high aspect-ratio process (HARP), wherein process gases may comprise tetraethyl-orthosilicate (TEOS) and ozone ($O_3$). In yet other embodiment, the STIs 312 may be formed using a spin-on-dielectric (SOD) process, such as hydrogen silsesquioxane (HSQ) or methyl silsesquioxane (MSQ). Other processes and materials may be used. A chemical mechanical polish (CMP) may be performed to form the STIs 312.

Also shown in FIG. 3, the patterned mask 106 is removed and the fins 104 are recessed. In an embodiment in which the patterned mask 106 includes the nitride pad layer 106b is formed of silicon nitride and the oxide pad layer 206a is formed of silicon oxide, the pad nitride layer 106b may be removed using a wet process using hot $H_3PO_4$, while pad oxide layer 106a may be removed using diluted HF acid.

An upper portion of the fins 104 is removed and is to be replaced by other semiconductor materials as described below with reference to FIG. 4. Using the STI regions 312 as a hard mask, an anisotropic plasma etching process is performed to recess fins 104 that are unprotected or exposed. The remaining portions of the fins 104 between the neighboring STI regions 312 are hereinafter referred to as lower fin portion 104l of the fin 104. In some embodiments, the lower fin portion 104l may include a first semiconductor material, such as a silicon substrate, having the first lattice constant. In some embodiments, the etching process may be performed using a chemical selected from $Cl_2$, HBr, $NF_3$, $CF_4$, and $SF_6$ as an etching gas. In some embodiments, the fins are recessed to a depth of about 60 nm to about 110 nm below an upper surface of the STIs 312.

Figure 4:
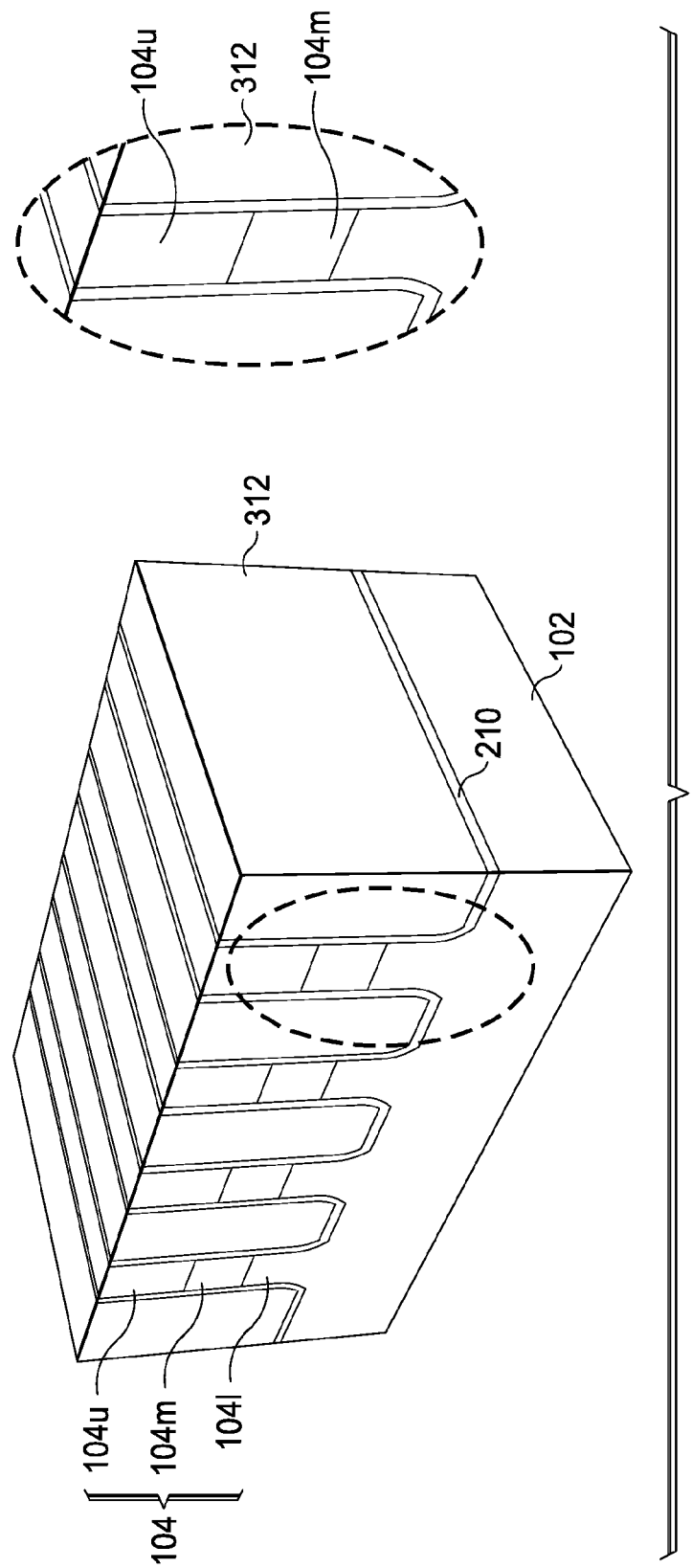

FIG. 4 illustrates reforming the fins 104 in accordance with an embodiment. In an embodiment, the fins 104 are reformed using one or more epitaxial processes. For example a middle fin portion 104m may be formed using an epitaxial process to grow a second semiconductor material having a second lattice constant different from the first lattice constant of the substrate 102. In an embodiment in which the substrate 102 comprises a silicon substrate, the middle fin portion 104m may be formed by epitaxially growing a silicon germanium (SiGe) material. In some embodiments, the SiGe is selectively grown by an LPCVD process to partially fill the recesses to form the middle fin portion 104m as illustrated in FIG. 4. In one embodiment, the LPCVD process is performed at a temperature of about 400° C. to about 800° C. and under a pressure of about 1 to about 200 Torr, using $SiH_2Cl_2$, $SiH_4$, $GeH_4$, HCl, $B_2H_6$, $H_2$, combinations thereof, or the like as reaction gases.

Still referring to FIG. 4, subsequent to the formation of the middle fin portion 104m, an upper fin portion 104u is formed of a semiconductor material having a third lattice constant different than the second lattice constant. The lower fin portion 104l and the upper fin portion 104u may be formed of the same material (e.g., silicon) or of different materials having different lattice constants.

In embodiments in which the upper fin portion 104u is formed of silicon, the upper fin portion 104u may be selectively grown by an LPCVD process at a temperature of about 400 to 800° C. and under a pressure of about 1 to 100 Torr, using SiH$_4$, and H$_2$ as reaction gases.

After the growing, a planarization process such as a CMP may be performed to planarize an upper surface of the fins 104 to an upper surface of the STIs 312 as illustrated in FIG. 4.

Figure 5:
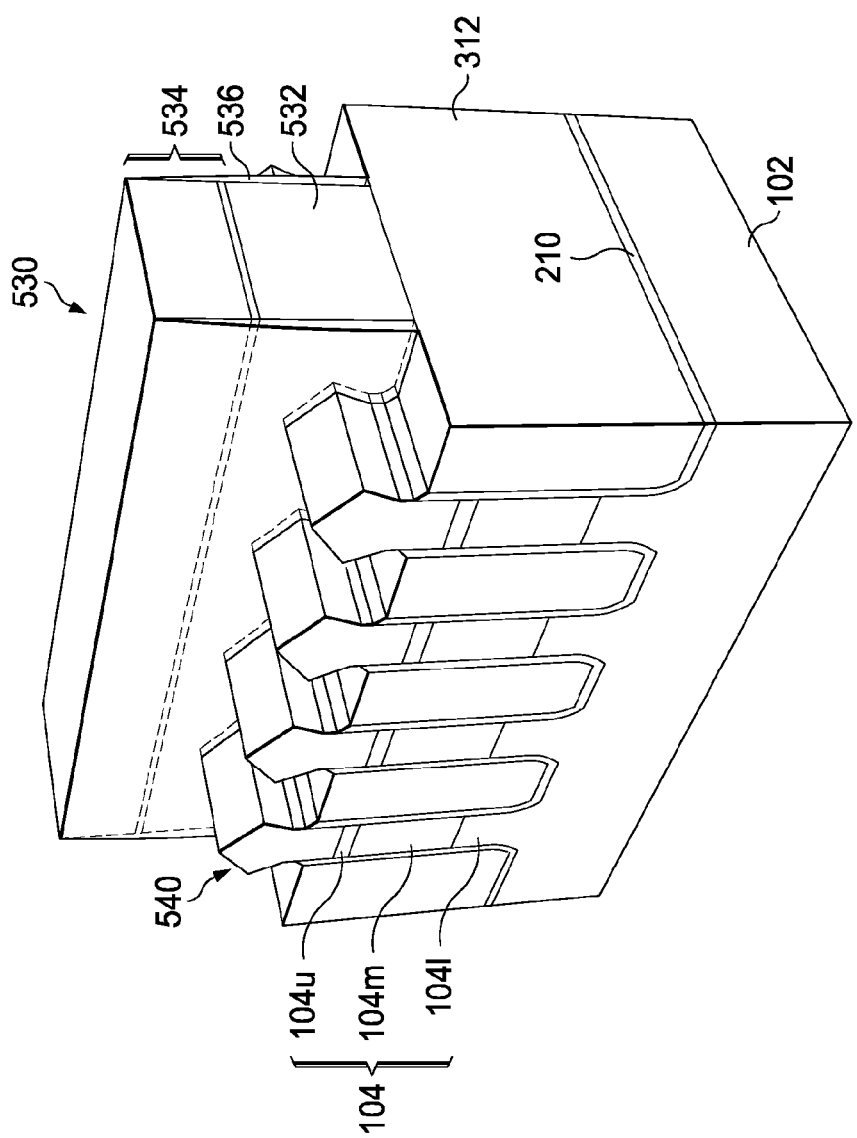

Referring now to FIG. 5, a dummy gate structure 530 and source/drain regions 540 are formed in accordance with an embodiment. In an embodiment, the STIs 312 are recessed exposing portions of the fins 104. Thereafter, the dummy gate structure 530 is formed by any suitable process and, in an embodiment, includes a dummy gate 532, a dummy gate mask 534, and dummy spacers 536. For example, the dummy gate structure 530 may be formed by depositing a dummy gate layer over the substrate 102 and a mask layer over the dummy gate layer by CVD, physical vapor deposition (PVD), atomic layer deposition (ALD), other suitable methods, and/or combinations thereof. A photolithography patterning process, including depositing a photoresist material, exposing according to a desired pattern, and developing, is used to pattern the mask layer and the dummy gate layer to form the dummy gate mask 534 and the dummy gate 532, respectively, as illustrated in FIG. 5. The etching processes include dry etching, wet etching, and/or other etching methods (e.g., reactive ion etching). The dummy gate layer may include any suitable material, such as silicon oxide, silicon nitride, polysilicon, or any other suitable materials. The dummy gate mask layer includes any suitable material, for example, silicon nitride, silicon oxynitride and silicon carbide. The dummy gate structure 530 may be replaced as discussed in greater detail below by, for example, a high-k (HK) gate insulator and metal gate (MG) after high thermal temperature processes are performed, such as thermal processes used to form the source/drain regions 540.

Lightly-doped drain (LDD) regions (not shown) may be formed in the fins 104 on opposing sides of the dummy gate and the dummy spacers 536 may be formed alongside the dummy gate 532. The LDD regions may be formed by implanting an appropriate n-type or p-type dopant, such as boron or phosphorous. The dummy spacers 536 may include one or more layers of a dielectric material such as silicon oxide, silicon nitride, silicon carbide, silicon oxynitride, or combinations thereof. The dummy spacers 536 may be formed by, for example, depositing a dielectric material over the gate stack and anisotropically etching back the dielectric material.

The source/drain regions 540 may be formed in the fins 104 along opposing sides of the dummy gate 532. The source/drain regions 540 may be a common source/drain region wherein multiple fins share a common source/drain region, or may be individual source/drain regions as illustrated in FIG. 5. The source/drain regions may be formed by recessing the fins 104 not masked by the dummy gate structure 530 and epitaxially growing a semiconductor material. The recessing process may include one or more dry etching process, wet etching process, and/or combination thereof. The recessing process may also include a selective wet etch or a selective dry etch. In some embodiments, portions of the STIs 312 may also be recessed to form, for example, a common source/drain trench.

A semiconductor material is epitaxially grown in the source/drain recesses to form the source/drain regions 540 as illustrated in FIG. 5. The epitaxial semiconductor material grown in the source/drain recesses may be, for example, Ge, Si, GaAs, AlGaAs, SiGe, GaAsP, or other suitable material. The source/drain regions 540 may be in-situ doped during the epitaxial process. For example, epitaxially grown silicon source/drain regions may be doped with carbon to form Si:C source/drain features, phosphorous to form Si:P source/drain features, boron to form Si:B source/drain features, or the like. In other embodiments, the source/drain features are doped by implantation.

Figure 6:
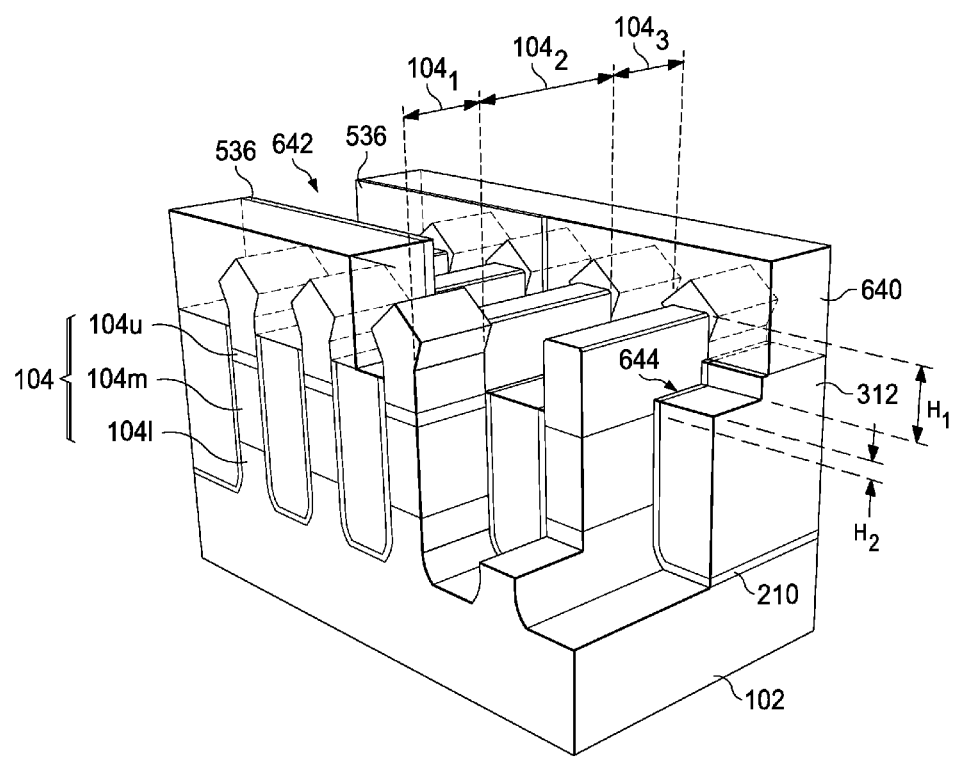

FIG. 6 illustrates the resulting structure of the fin 104 after the formation of the source/drain regions 540. In particular, FIG. 6 illustrates that the fin 104, in addition to having multiple sections in a vertical direction (e.g., the lower fin portion 104l, the middle fin portion 104m, and the upper fin portion 104u), the fin 104 also has multiple sections in a horizontal direction, such as a first section 104$_1$, a second section 104$_2$, and a third section 104$_3$, with the first section 104$_1$ and the third section 104$_3$ being located under the source/drain regions 504, and the second section 104$_2$ being located under the dummy gate structure 530 (not seen in FIG. 6 but illustrated above with respect to FIG. 5). Each of the first section 104$_1$, the second section 104$_2$, and the third section 104$_3$ comprise the lower fin portion 104l, the middle fin portion 104m, and the upper fin portion 104u, although the upper fin portion 104u in the second section 104$_2$ may have a greater thickness as the second section 104$_2$ was protected by the dummy gate structure 530 during the formation of the source/drain regions 540.

FIG. 6 also illustrates formation of an interlayer dielectric (ILD) 640 and removal of the dummy gate mask 534 and dummy gate 532 in accordance with an embodiment. The ILD 640 is formed of one or more layers of dielectric material, such as silicon oxide, oxynitride or other suitable materials, formed by a suitable technique, such as CVD, ALD, and spin-on (SOG). A CMP process may be performed to remove excessive material of the ILD 640 and planarize the top surface of the ILD 640 with the top surface of the dummy gate structure 530 (see FIG. 5).

The dummy gate mask 534 and dummy gate 532 are removed to form a gate trench 642. Furthermore, in some embodiments the STIs 312 along a bottom of the gate trench are recessed to expose additional sidewall portions of the upper fin portion 104u in the second section 104$_2$, thereby forming an STI recess 644 in the channel region as illustrated in FIG. 6. The etching processes may include selective wet etch or selective dry etch having an etch selectivity between the dummy gate mask 534 and dummy gate 532 and the ILD 640 and the gate spacers 536 (if present). Alternatively, dummy gate mask 534 and dummy gate 532 may be recessed by a series of processes including photolithography patterning to protect the other regions (e.g., the ILD 640) and etching back the dummy gate mask 534 and dummy gate 532. In an embodiment, the STI recess 644 is such that a first height H$_1$ of the fin 104 in the second section 104$_2$ extending above an uppermost surface of the STIs 312 is about 30 nm to about 50 nm, and a second height H$_2$ from a bottom of the STI recess 644 to an upper surface of the STIs 312 is about 3 nm to about 20 nm.

Figure 7:
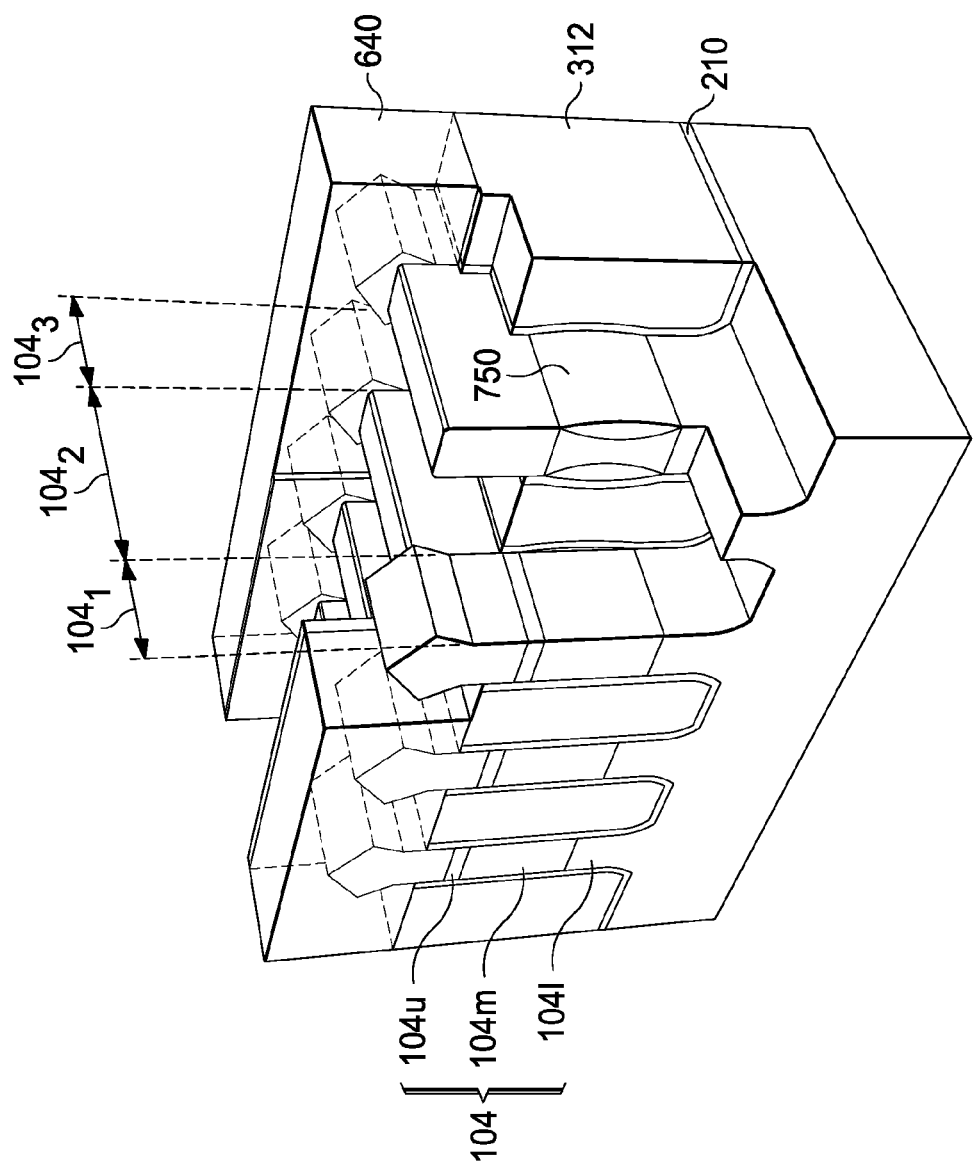

As depicted in FIG. 7, oxidation regions 750 are formed along sidewalls of the middle fin portion 104m in the second section 104$_2$ in accordance with an embodiment. The oxidation regions 750 are formed in the channel region (e.g., below the gate trench 642, see FIG. 6) and exerts a volume stress on the channel region. As explained above, during and after the oxidation process, elements of the second semiconductor material of the middle fin portion 104m may tend to migrate, such as the tendency of the Ge of a SiGe layer migrating into an overlying Si layer and/or into the STIs 312. Additionally, the Ge diffusing into the STIs 312 may migrate to the silicon layer of the fins. The nitride layer of the liners helps reduce or prevent this migration.

In an embodiment, the oxidation process comprises a thermal is performed at a temperature of about 400° C. to about 600° C. and under a pressure of about 1 atm to about 20 atm, using $H_2O$ as a reaction gas. As the oxidation rate of silicon within SiGe is faster than in pure silicon, in an embodiment in which the middle fin portion 104m in the second section $104_2$ is SiGe and the upper fin portion 104u in the second section $104_2$ is Si, the middle fin portion 104m in the second section $104_2$ will oxidize faster and the process can be controlled to oxidize the middle fin portion 104m instead of the upper fin portion 104u in the second section $104_2$.

As a result of the oxidation, notches are formed along sidewalls of the middle fin portion 104m in the second section $104_2$. For example, in an embodiment in which the middle fin portion 104m in the second section $104_2$ of the fin 104 is formed of a SiGe material, the oxidation regions 750 may comprise SiGeO. The notches of the oxidation regions 750 extend into opposite sides of the middle fin portion 104m and may further extend into an upper edge portion of the lower fin portion 104l and a lower edge portion of the upper fin portion 104u.

FIG. 7 also illustrates that, once the notches have been formed along the sidewalls of the fin 104 in the second section $104_2$, any oxidation that has occurred on the upper fin portion 104u in the second section $104_2$ may be removed to again expose the semiconductor material. In an embodiment the removal of the oxidized material may be performed using, e.g., a wet etch or other suitable process.

In some embodiments, the fin 104 may be further oxidized until the oxidation regions on opposing sides of the fin 104 contact each other, thereby an oxide layer surrounding remaining portions of the second semiconductor material. For example, in an embodiment in which the middle fin portion 104m in the second section $104_2$ of the fin 104 was formed of SiGe, a SiGeO oxide may surround remaining portions of the SiGe material.

Figure 8:
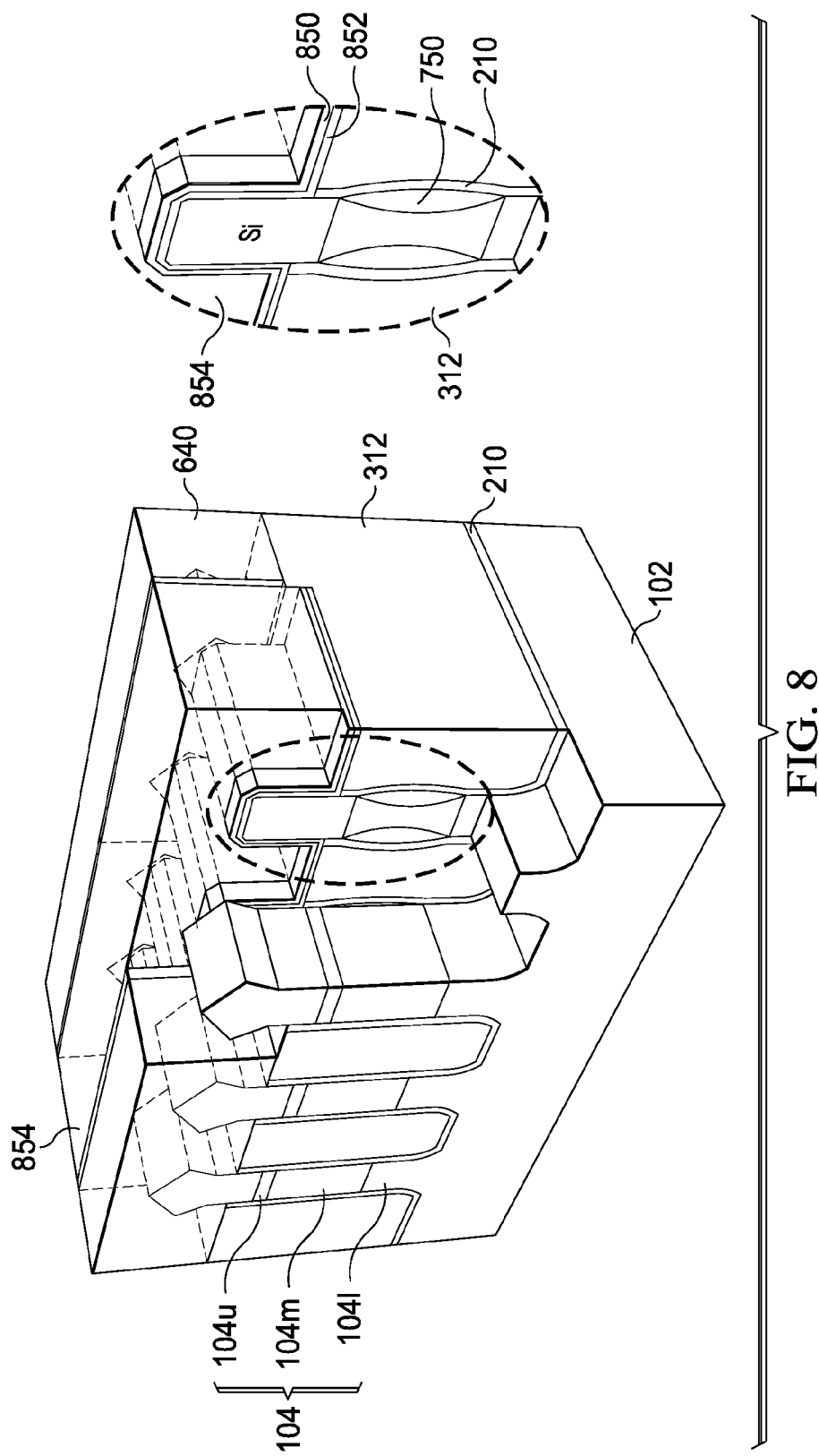

Thereafter, additional processes may be performed. For example, FIG. 8 illustrates an interfacial layer 850 formed along sidewalls and a bottom of the gate trench 642, a high-k gate insulator 852, and a metal gate 854 in accordance with an embodiment. The interfacial layer 850 may be formed of an oxidie, HfSiO, oxynitride, or the like by ALD, CVD, ozone oxidation or the like. The high-k gate insulator (e.g., a material having a dielectric constant greater than silicon oxide) may be formed of a dielectric material, such as LaO, AlO, ZrO, TiO, $Ta_2O_5$, $Y_2O_3$, $SrTiO_3$ (STO), $BaTiO_3$ (BTO), BaZrO, HfZrO, KfLaO, HfAlO, HfSiO, LaSiO, AlSiO, HfTaO, HfTiO, $(Ba,Sr)TiO_3$ (BST), $Al_2O_3$, $Si_3N_4$, oxynitrides (SiON), or other suitable materials.

The metal gate 854 may include one or more layers of a conductive material, such as Ti, Ag, Al, TiAlN, TaC, TaCN, TaSiN, Mn, Zr, TiN, TaN, Ru, Mo, Al, WN, Cu, W, or other suitable materials formed by ALD, PVD, CVD, or other suitable processes. A planarization process, such as a CMP process, may be used to remove excess material from a surface of the ILD 640.

It should be noted that the structures discussed above may include other features. For example, additional doped regions, such as wells, liners/barrier layers, dielectric layers and metallization layers, and the like may be formed. Additionally, PMOS and NMOS devices may be formed using, for example, different types of dopants, semiconductor materials, gate materials, and the like.

Figure 9:
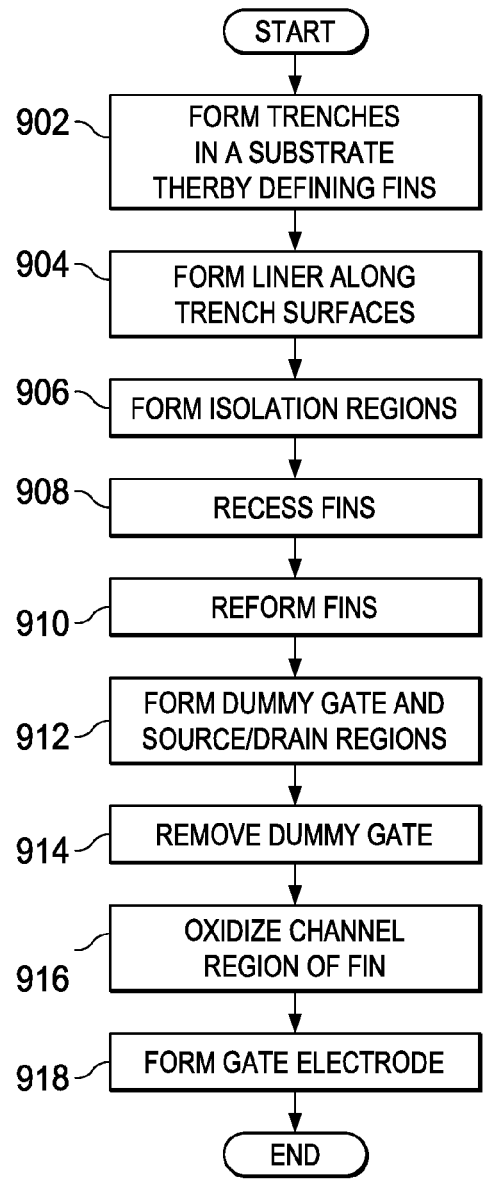
FIG. 9 is a flowchart illustrating a method of fabricating a semiconductor device according to various aspects of the present disclosure.

FIG. 9 is a flowchart illustrating a method that may be performed in accordance with an embodiment. The method begins at step 902, wherein trenches are formed in a substrate, such as that discussed above with reference to FIG. 1. Adjacent trenches define a fin interposed between the trenches. In step 904, a liner is formed along sidewalls and bottom of the trenches, such as that discussed above with reference to FIG. 2. The liner may be, for example, an oxynitride, such as a silicon oxynitride in an embodiment in which the fins are formed of a silicon. The liner may be a single layer or a multi-layer (e.g., a silicon oxide layer and a silicon oxynitride layer) and may be formed by an oxidation process followed by a nitridation process.

In step 906, isolation regions, such as shallow trench isolations, are formed in the trenches by forming a dielectric material in the trenches. After forming the isolation regions, the fins are recessed in step 908, such as that discussed above with reference to FIG. 3.

The fins are reformed in step 910. The fins may be reformed to include one or more layers of semiconductor materials having different lattice constants. For example, a SiGe layer may be epitaxially grown on a silicon substrate in the recess, and a silicon layer may be epitaxially grown on the SiGe layer. Thereafter, in step 912, a dummy gate and source/drain regions are formed, such as that discussed above with reference to FIG. 5. The dummy gate may be formed by depositing a conformal layer of a dummy gate material and a mask layer of the dummy gate material layer and using photolithography techniques to pattern the dummy gate. LDD implants may be formed and source/drain regions may be formed.

Next, in step 914, the dummy gate is removed, such as discussed above with reference to FIG. 6. The dummy gate may be removed such that a recess is formed in the STIs along the channel region of the fins, thereby exposing portions of the sidewalls of the fin in the channel region. In step 916, an oxidation process is performed to oxidize, for example, portions of the SiGe layer, creating stress by volume expansion, such as described above with reference to FIG. 7. Thereafter, in step 918, a gate electrode is formed, such as discussed above with reference to FIG. 8.

In an embodiment, a FinFET is provided. The FinFET includes a substrate and a fin structure extending from the substrate. The fin structure includes a lower portion, an upper portion, and a middle portion interposed between the lower portion and the upper portion, wherein the middle portion has a lattice constant different than lattice constants of the lower portion and the upper portion, and the middle portion has oxidized portions along opposing sidewalls. Isolation regions are adjacent opposing sides of the fin structure, and a liner is interposed between the isolation regions and the oxidized portions.

In another embodiment, a FinFET is provided. The FinFET includes a substrate having a plurality of trenches in the substrate. A fin is interposed between adjacent ones of the trenches, and the fin includes a first semiconductor material and a second semiconductor material on the first semiconductor material. A first dielectric material is in the trenches. Notches of a second dielectric material are along sidewalls of the second semiconductor material, and a dielectric liner is interposed between first dielectric material and the second dielectric material.

In yet another embodiment, a method of fabricating a semiconductor device is provided. The method includes providing a substrate having trenches formed therein, the region between adjacent trenches forming a fin, the fin comprising a first semiconductor material. A liner is formed along sidewalls of the trenches, and a dielectric material is formed over the liner in the trenches. A portion of the fin is replaced with a second semiconductor material, wherein the second semiconductor material has a different lattice constant than the first semiconductor material. A portion of the second semiconductor material is oxidized, and a gate electrode is formed over the fin.

In yet another embodiment, a method of fabricating a semiconductor device is provided. The method includes forming a fin extending from a substrate, the fin having a lower layer of a first semiconductor material, a middle layer of a second semiconductor material, and an upper layer of a third semiconductor material, wherein the second semiconductor material is a different semiconductor material than the first semiconductor material and the third semiconductor material, wherein the middle layer is interposed between the lower layer and the upper layer, wherein the fin has isolation regions along opposing sidewalls of the fin, sidewalls of the upper layer extending above an upper surface of the isolation regions. A source region and a drain region of the fin is covered such that at least a portion of the upper layer in a channel region is exposed, and the middle layer of the fin in the channel region of the fin is oxidized, causing opposing sidewalls of the middle layer to oxidize. A gate electrode is formed over the channel region of the fin.

In yet another embodiment, a method of fabricating a semiconductor device is provided. The method includes forming a fin extending from a substrate, forming a liner along sidewalls of the fin, forming isolation regions over the liner along opposing sidewalls of the fin, recessing the fin providing a lower fin layer, and forming a middle fin layer over the lower fin layer, forming an upper fin layer over the middle fin layer, the middle fin layer having a different lattice structure than the lower fin layer and the upper fin layer. The isolation regions are recessed exposing sidewalls of the upper fin layer, and a dummy gate is exposed over a channel region of the upper fin layer. A dielectric layer is formed over the upper fin layer on opposing sides of the dummy gate, and the dummy gate is removed. The method further includes recessing the isolation regions adjacent the channel region such that the isolation regions adjacent the channel region is recessed lower than the isolation regions adjacent a source region and a drain region, oxidizing at least a portion of the middle fin layer, and forming a gate electrode over the channel region.

While the disclosure has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a semiconductor device, the method comprising:
   providing a substrate having trenches formed therein, a region between adjacent trenches forming a fin, the fin comprising a first semiconductor material;
   forming a liner along sidewalls of the trenches;
   forming a first dielectric material over the liner in the trenches;
   replacing a portion of the fin with a second semiconductor material, the second semiconductor material having a different lattice constant than the first semiconductor material;
   oxidizing sidewalls of the second semiconductor material, thereby forming notches of a second dielectric material along sidewalls of the fin; and
   forming a gate electrode over the fin.

2. The method of claim 1, further comprising forming a third semiconductor material over the second semiconductor material, the third semiconductor material having a different lattice constant than the second semiconductor material.

3. The method of claim 1, wherein the liner completely separates the second dielectric material from the first dielectric material.

4. The method of claim 1, wherein the liner is an oxynitride liner.

5. The method of claim 1, wherein the forming the liner comprises:
   forming an oxide layer along the sidewalls of the trenches; and
   performing a nitridation process on the oxide layer, creating an oxynitride layer.

6. The method of claim 5, wherein the oxynitride layer has a thickness of about 3 nm to about 10 nm.

7. A method of fabricating a semiconductor device, the method comprising:
   forming a fin extending from a substrate, the fin having a lower layer of a first semiconductor material, a middle layer of a second semiconductor material, and an upper layer of a third semiconductor material, wherein the second semiconductor material is a different semiconductor material than the first semiconductor material and the third semiconductor material, wherein the middle layer is interposed between the lower layer and the upper layer, wherein the fin has isolation regions along opposing sidewalls of the fin, sidewalls of the upper layer extending above an upper surface of the isolation regions;
   covering a source region and a drain region of the fin such that at least a portion of the upper layer in a channel region is exposed;
   oxidizing the middle layer of the fin in the channel region of the fin, the oxidizing causing opposing sidewalls of the middle layer to oxidize; and
   forming a gate electrode over the channel region of the fin.

8. The method of claim 7, further comprising, after the oxidizing, removing an oxidized layer from a surface of the upper layer.

9. The method of claim 7, further comprising forming a liner along sidewalls of the middle layer of the fin.

10. The method of claim 9, wherein the liner comprises a nitrogen-containing layer.

11. The method of claim 7, wherein the covering the source region and the drain region comprises:
    forming a dummy gate over the channel region;
    forming an dielectric layer over the source region and the drain region; and
    removing the dummy gate.

12. The method of claim 11, further comprising, after removing the dummy gate, recessing the isolation regions adjacent the channel region.

13. The method of claim 12, wherein the middle layer is unexposed during the oxidizing.

14. A method of fabricating a semiconductor device, the method comprising:
forming a fin extending from a substrate;
forming a liner along sidewalls of the fin;
forming isolation regions over the liner along opposing sidewalls of the fin;
recessing the fin providing a lower fin layer;
forming a middle fin layer over the lower fin layer;
forming an upper fin layer over the middle fin layer, the middle fin layer having a different lattice structure than the lower fin layer and the upper fin layer;
recessing the isolation regions exposing sidewalls of the upper fin layer;
forming a dummy gate over a channel region of the upper fin layer;
forming a dielectric layer over the upper fin layer on opposing sides of the dummy gate;
removing the dummy gate;
recessing the isolation regions adjacent the channel region such that the isolation regions adjacent the channel region is recessed lower than the isolation regions adjacent a source region and a drain region;
oxidizing at least a portion of the middle fin layer; and
forming a gate electrode over the channel region.

15. The method of claim 14, wherein the recessing the isolation regions adjacent the channel region does not expose the middle fin layer.

16. The method of claim 14, wherein the oxidizing forms notches of a dielectric material along sidewalls of the middle fin layer.

17. The method of claim 14, wherein the oxidizing forms an oxide layer extending from a first sidewall of the middle fin layer to a second sidewall of the middle fin layer.

18. The method of claim 14, wherein the liner comprises a nitrogen containing layer.

19. The method of claim 14, wherein the forming the liner comprises:
forming an oxide layer along the sidewalls of the fin; and
performing a nitridation process on the oxide layer, creating an oxynitride layer.

20. The method of claim 14, further comprising, after the oxidizing, removing an oxidized layer from a surface of the upper fin layer.

* * * * *